United States Patent [19]

Poehnitzsch

[11] Patent Number: 4,839,867
[45] Date of Patent: Jun. 13, 1989

[54] METHOD FOR REFRESHING DATA IN A DYNAMIC RANDOM ACCESS MEMORY UNIT AND CONTROL UNIT FOR THE IMPLEMENTATION OF THE METHOD

[75] Inventor: Guenter Poehnitzsch, Munich, Fed. Rep. of Germany

[73] Assignee: Siemens Aktiengesellschaft, Berlin and Munich, Fed. Rep. of Germany

[21] Appl. No.: 210,217

[22] Filed: Jun. 17, 1988

Related U.S. Application Data

[63] Continuation of Ser. No. 913,696, Sep. 30, 1986, abandoned.

[30] Foreign Application Priority Data

Sep. 30, 1985 [DE] Fed. Rep. of Germany ....... 3534835
Jul. 11, 1986 [DE] Fed. Rep. of Germany ....... 3623472

[51] Int. Cl.[4] .................... G11C 7/00; G11C 11/40
[52] U.S. Cl. ..................................... 365/222; 365/233
[58] Field of Search .................... 365/189, 222, 233

[56] References Cited

U.S. PATENT DOCUMENTS

| | | | |
|---|---|---|---|
| 3,684,897 | 8/1972 | Anderson et al. | 365/222 |
| 3,737,879 | 6/1973 | Greene et al. | 365/222 |
| 4,317,169 | 2/1982 | Panepito, Jr. et al. | 365/222 X |
| 4,376,988 | 3/1983 | Ludwig et al. | 365/222 |
| 4,625,301 | 11/1986 | Berger | 365/222 |
| 4,628,488 | 12/1986 | Saku et al. | 365/222 |

FOREIGN PATENT DOCUMENTS 0145413 6/1985 European Pat. Off. .
2517872 6/1976 Fed. Rep. of Germany .

OTHER PUBLICATIONS

Evans, M., "Designing ... Rams", Electronic Engineering, Apr. 1979, pp. 95–101.

Primary Examiner—Stuart N. Hecker
Assistant Examiner—Alyssa H. Bowler
Attorney, Agent, or Firm—Hill, Van Santen, Steadman & Simpson

[57] ABSTRACT

A method for controlling refreshing of data in a dynamic memory unit comprising a refresh generator and a timer provides that during a time interval of, for example, 10-16 $\mu$s between two successively following refresh cycles, a first memory cycle at the beginning of a first time interval of, for example, 10 $\mu$s lying therein triggers a refresh cycle that is concluded in the pause between cycles before the possible leading edge of an earliest possible, next memory cycle. Each further memory cycle within the first time interval, which is clearly longer than the minimum duration of, for example, 1 $\mu$s between the start times 2 memory cycles following immediately upon one another, subsequently triggers no further refresh cycle. After the beginning of the following, second time interval of, for example, 5 $\mu$s, a next, $x^{th}$ memory cycle occurring within the second time interval triggers a next refresh cycle which is concluded before the possible start of an earliest possible, $x+1^{st}$ memory cycle, whereby the $x^{th}$ memory cycle or a clock derived therefrom triggers the beginning of a new first time interval, so that every further memory cycle after the next refresh cycle which lies within the new first time interval does not trigger any further refresh cycle. In case no $x^{th}$ memory cycle is executed in the second time interval, the next refresh cycle is quickly triggered subsequent thereto, i.e., for example, 16 $\mu$s after the start of the new first time interval, this in turn again triggering the start of a next, first time interval.

3 Claims, 2 Drawing Sheets

METHOD FOR REFRESHING DATA IN A DYNAMIC RANDOM ACCESS MEMORY UNIT AND CONTROL UNIT FOR THE IMPLEMENTATION OF THE METHOD

This is a continuation of application Ser. No. 913,696, filed Sept. 30, 1986, now abandoned.

BACKGROUND OF THE INVENTION

1. Field of the Invention

The present invention relates to a method for controlling for refreshing of data in a dynamic random access memory unit, for example, in random access memory (RAM) large-scale memory units of a central control unit of an electronic switching system. In such memory units, the central control unit has relatively many, long connections with high running times between its many components. In such a system, there is a plurality of groups of memory cells, whereby refreshing is executed in stages. In particular, refreshing of the memory is performed in groups, so that normal memory cycles, i.e., read and/or write cycles, can be executed between the successively following two groups. A refresh generator is provided for generating refresh voltages respectively required for the refreshing operation and at least a single timer is provided for measuring intervals. A short pause of, for example, 400 ns, is provided between the end of the memory cycle or write cycle, on the one hand, and a next possible such memory cycle following immediately thereafter in close proximity, on the other hand. Such a system can contain one or more RAM semiconductor chips. For a RAM memory unit containing a maximum of 128 groups of memory cells to be successively refreshed in and of themselves, 128 refresh cycles within a maximum duration of, for example, 2 ms is required for refreshing all groups therein. More specifically, in such a method, the present invention is concerned with avoiding time losses caused by the known refresh cycle control.

2. Description of the Prior Art

Each memory cell in such a RAM memory unit must be refreshed by way of the refresh cycles controlled by a refresh generator in regular intervals, for example, after a maximum duration of 2 ms. Otherwise, the memory cells would lose their stored information relatively quickly due to self-discharge. In the prior art, as well as in the present invention, a single refresh generator can thereby basically supply not only a single RAM memory unit, but can even supply a great number of different RAM memory units with their individually-required refresh cycles.

Frequently, an entire RAM memory unit that is in need of refreshing is not simultaneously refreshed. On the contrary, the refreshing is carried out in stages, in a respectively small group of memory cells of the RAM memory unit. For example, in a RAM memory unit constructed matrix-like and having, for example, 128 groups, only all memory cells of a single memory row or of a single memory column are respectively refreshed. Read and write cycles, i.e., normal memory cycles, can be executed between the stages. Refreshing the entire memory unit then occurs successively in many individual refresh cycles, each of which lasts far less than 1 μs, with respectively long-lasting (for example, 15 μs) interruptions between the refresh cycles that can be used for subsequent memory cycles. In this case, in particular, the time interval between two refresh cycles amounts to, for example, that maximum duration of 2 ms, for example, divided by the number of groups of memory cells of the RAM memory unit, i.e., given a RAM memory unit having 128 groups, for example, 2 ms ÷ 128 = about 15 μs.

The known RAM memory units are refreshed, for example, in that they use a request signal to request a refresh cycle from a central computing unit and, finally, are granted the refresh cycle by way of a grant signal.

As in the prior art, a refresh cycle (5 in FIG. 2) does not occur between all memory cycles (1/2/3/4) in the present invention. A refreshing of all memory cells in each memory cycle is generally neither necessary nor economical. Every refresh cycle, in particular, generates a relatively high load on the power supply of the RAM memory unit. At least a longer time interval in therefore placed between two refresh cycles triggered by memory cycles, many memory cycles (1/2/3/4) being in fact capable of taking place during this longer time interval but no refresh cycles.

In the known RAM memory units, no access from the exterior, i.e., from an externally-connected processor, to the appertaining RAM memory unit is permitted during the duration of a refresh cycle, i.e., no normal memory cycle is executed, such as a read cycle or a write cycle. Normally, therefore, the RAM memory unit is inhibited for the initiation of such normal memory cycles during the refresh cycle. Only when the refresh cycle for refreshing the appertaining memory cells has been carried out is the RAM memory unit enable again for external accesses, i.e., for the next read and/or write cycles.

SUMMARY OF THE INVENTION

It is the object of the present invention to avoid, or at least largely avoid, time losses which are caused by the known refresh cycle control and, depending on the type of RAM memory employed and on the frequency of the system clock employed, can amount, for example, to 5% and far more of the duration of the execution of the longer program. The time loss has been avoided by the following features.

The control during the time duration of, for example, 10–16 μs, between two successively following refresh cycles, is differently managed in a special manner in a first time interval of, for example, 10 μs, than in a second time span of, for example, about 0–5 μs following thereon. In particular, at approximately the beginning of the first time interval, a first memory cycle triggers a refresh cycle, referred to as a first refresh cycle. Triggering occurs by way of a time delay circuit which generates a delay clock control and a refresh generator for the execution of the refresh cycle in response to the leading edge of the start clock of the first memory cycle. The first refresh cycle is still conducted in the pause before the possible beginning of an earliest possible, next memory cycle. However, after the first refresh cycle within the first time interval, each further memory cycle does not trigger any further refresh cycle. The first time interval is clearly longer than the minimum duration of about 1 μs between the start times of two successive memory cycles.

After the beginning of the second time interval, the next memory cycle, referred to as the $x^{th}$ memory cycle, occurring within the second time interval, for example, 2 μs after the end of the most recently expired first time interval, like the first memory cycle triggers a next refresh cycle. The $x^{th}$ memory cycle is ended in the appertaining pause before the possible start of a next earliest possible $(x+1^{st})$ memory cycle. The $x^{th}$ memory cycle, for example, the beginning of the start clock thereof, or a clock derived therefrom, and the next refresh cycle triggered thereby, triggers at the beginning of a new, first time interval of, for example, 10 μs by influencing the appertaining timer. Therefore, after the next refresh cycle within the new first time interval, in particular on the basis of a reset pulse acting on the timer, every further memory cycle triggers no further refresh cycle.

However, in case no $s^{th}$ memory cycle and, therefore, no next refresh cycle as well was executed in the second time interval, a next refresh cycle, i.e., an emergency refresh cycle, is triggered in a forced manner immediately successive thereto, as is the beginning of a next first time interval. The emergency refresh cycle is triggered, for example, 16 μs after the beginning of the previous, first time interval, despite the lack of the $n^{th}$ memory cycle. The next first time interval is, for example, 10 μs.

Given operation in accordance with the present invention, therefore, time intervals of variable length are inserted, the respectively next refresh cycle normally appearing therein at a statistically-varying time. At least approximately, this next refresh cycle thereby corresponds to the immediate beginning of a new, first time interval. It has been shown, in particular, that the pauses between the individual, normal memory cycles are sufficiently long, at least given a large-scale computer as represented by the central control unit of an electronically-control switching system, in order to still be able to execute the refresh cycle in a highly-efficient and time-saving manner between two normal memory cycles which follow immediately upon one another and without inhibiting access to the RAM memory unit.

The present invention therefore solves the problem of avoiding time losses on the basis of a special interleaving of the refresh cycle with the pause between the normal memory accesses, for example, between two read cycles. Since an inhibit of the RAM memory unit for the initiation of normal memory cycles is unnecessary at least during the first and the second time intervals and is therefore suppressed, those time losses that are required in the art for inhibiting access to the RAM memory unit are avoided by the present invention. Such inhibit of the memory unit is potentially suppressed even during the emergency refresh cycle. The time losses for refreshing are at least largely, if not even completely, avoided, for example, the aforementioned 5% and more of the operating time of the memory.

The present invention therefore offers an easily-implementable method for refreshing data in a dynamic RAM memory unit to be refreshed in stages and to which a refresh generator having at least a single timer is assigned. Even the expense of inhibiting access to the memory can be at least largely eliminated. The RAM memory unit exhibits a short pause of, for example, 400 ns between an end of the memory cycle, i.e., an end of a read cycle and/or of a write cycle, on the one hand, and a next possible memory cycle of the same type following immediately thereon, on the other hand. The RAM memory unit can thereby contain, for example, one or more RAM semiconductor chips.

Although the present invention was developed and tested for a RAM memory unit which contains 128 groups of memory cells which are successively refreshed in and of themselves and therefore requires 128 refresh cycles within an overall maximum time duration of, for example, 2 ms for the stage-by-stage refreshing of all groups contained therein, the invention can also be generally applied to all RAM memory units of the type generally set forth herein. Additional features of the invention give rise to additional advantages. A first of these is to allow the read cycles, which normally last a short time in comparison to a write cycle, to used as refresh cycle initiators in the first and second time intervals. This thereby allows the method of the invention to be applied, at least to a great extent, even when the write cycles last too long for them to be employed as refresh cycle initiators. A further feature of the invention is to allow the appertaining control unit to be constructed in a particularly simple manner.

The present invention shall be set forth below in greater detail with reference to the drawings which relate to a specific example of a control unit for the execution of the refresh cycle of a RAM memory unit having, for example, 128 memory cells or, respectively, groups. In the illustrated example, the row-address-strobe (RAS) clock is combined, according to the present invention, for refreshing with a refresh cycle clock which, in this example, refreshes the group memory cells forming, for example, a memory row.

The present invention, however, is not limited to the specific control unit embodiment as shown, nor is it limited to the example of timing shown. The RAM memory unit itself can therefore be arbitrarily constructed on principle and, apart from the clocks to be generated in accordance with the invention, can be supplied with arbitrary, other clocks matching this structure. For example, an EDC code or the module Am 2960 should be used in this RAM memory unit in order to protect data.

BRIEF DESCRIPTION OF THE DRAWINGS

Other objects, features and advantages and advantages of the invention, its organization, construction and operation will be best understood from the following detailed description, taken in conjunction with the accompanying drawings.

DESCRIPTION OF THE PREFERRED EMBODIMENTS

Figure 1:
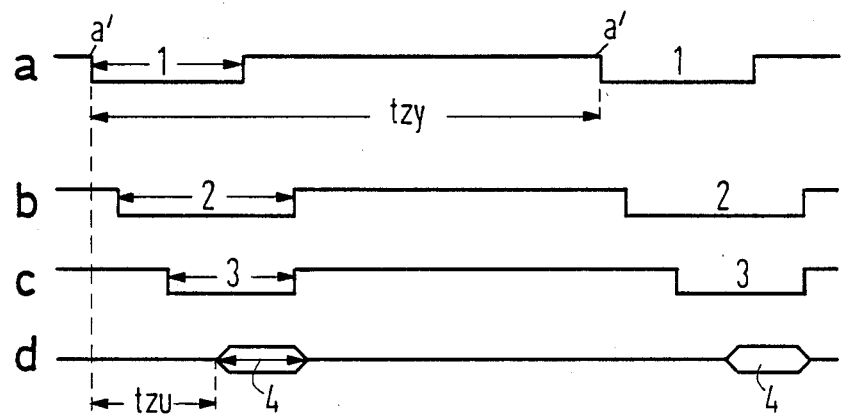
FIG. 1 is a timing diagram, dependent in detail on the respective specific structure and on the specific operation of a RAM memory unit, for the timing of the various clocks for a read cycle (or write cycle) 1/2/3/4 during the first time interval r. No refresh cycle can be triggered in the first time interval r, except for close to the beginning of the time interval r. Line a illustrates an exemplary curve of the start clock 1 supplied to the RAM memory unit from a central computer unit. The leading edge a' of a line represents the start of the cycle. It is assumed here that a next, second start clock 1 of a next, second read cycle would be immediately supplied to the RAM memory unit at the earliest possible time after the first start clock 1 of a first read cycle. Line b shows a sequencing example of an RAS clock 2 which is free of refresh cycles. Line c shows a sequencing example of an appertaining column-address-strobe (CAS) clock 3, and line d shows an example of the time durations 4 at which data can be present at the output of the RAM memory unit during such a read cycle, corrected by way of an air detection code (EDC) as needed.
Figure 2:
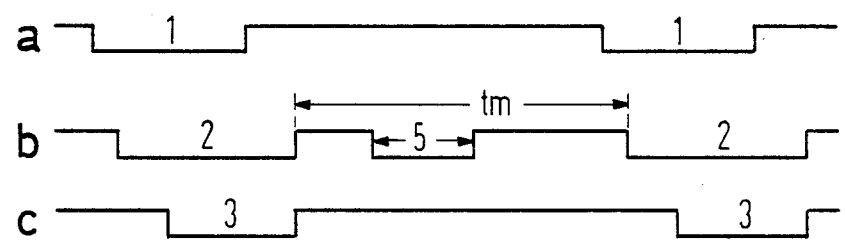
FIG. 2 is a timing diagram of the curves a, b, c illustrated in FIG. 1, but now shown during the duration of a clock 5 of a refresh cycle inserted chronologically interleaved into the pause between two RAS clocks 2 following one another in close succession. In particular, the refresh cycle is inserted between the end of a first read event 1/2/3/4 and the beginning of the earliest possible next RAS clock 2 of a next read event 1/2/3/4. Line d of FIG. 1 is not repeated for simplicity, despite the clock 5 of the refresh cycle inserted into the line d, in particular, so that FIG. 2 is otherwise identical with FIG. with reference to the clocks 1 and 2.

In the illustrated example, the duration tzy between the start times a' of two read or write cycles following one another in close proximity respectively amounts to about 1 μs, cf. FIGS. 1 and 2. During the interval 4, therefore, the read output of the RAM memory unit already supplies the read out (for example, already EDC corrected) data, and it in fact already supplies these data after the shortest access time tzu shown in FIG. 1 which amounts to, for example 440 ns.

After the data had been read from the RAM memory unit, the RAM memory unit must observe an idle time tm (cf. FIG. 2) which is at least equal in length to the (minimum) idle time tr prescribed for the RAM memory unit by its manufacturer, but which is rather substantially longer than the (minimum) idle time tr prescribed by the RAM memory unit manufacturer. This is particularly true for large-scale memories of central control units of switching technology due to the long signal running times on the particularly long lines therein.

Since, particularly given large-scale memories of switching technology, for example, in an EWSD telephone switching system, the appertaining pause time tm is longer than the required duration of the refresh cycle 5, the required refresh cycle 5 can occur in such a pause tm, i.e., even immediately between two memory cycles following one another in close proximity. The refresh cycle 5 can also occur without inhibiting the access to the RAM memory unit. In accordance with the present invention, therefore, the pause tm which generally lasts sufficiently long in normal operation of a RAM memory unit is coemployed for refreshing.

According to the invention, therefore, each memory cycle, referred to as the first memory cycle 1/2/3/4 at first fundamentally immediately starts a first next memory cycle 1/2/3/4, this first refresh cycle being already ended before the beginning a' of the next memory cycle. More precisely, it is the leading edge a' of the start clock of the first memory cycle which starts the next cycle. A first time interval r begins approximately with the refresh cycle 5, for example, by resetting the appertaining timer. The first time interval r, for example, lasts 10 μs (cf. FIGS. 1, 2 and 4) and is noticeably longer than the minimum duration of, for example, 1 μs between the start times a' of two memory cycles following one upon the other or, respectively, of two start clocks 1 following one upon another (cf. FIGS. 1 and 2). Within the first time interval r, each further start clock 1 after the end of the first refresh cycle 5, however, does not trigger a further refresh cycle 5.

In accordance with the invention, the second time interval s is inserted after the first time interval r and lasts, for example, a maximum of 5 μs and appears after the end of the most recently expired, first time interval r. A next start clock 1 is referred to as an $x^{th}$ start clock 1 of a memory cycle which appears in the second time interval s (FIG. 4), for example, 2 μs after the end of the most recently expired first time interval r. Only the next start clock again respectively acts in the same manner at the first start clock 1 of the first memory cycle. This is because before the possible beginning a' of what is then an earliest possible, next $x+1^{st}$ start clock 1 of a memory cycle 1/2/3/4, it triggers a next refresh cycle 5 which is still ended before the possible beginning a' of the $x+1^{st}$ memory cycle 1/2/3/4. The next refresh cycle 5, in the manner set forth above, again triggers the beginning of a new, first time interval r of, for example, 10 μs. In particular, for example, this start clock 1 or a clock directly or indirectly derived therefrom, such as the refresh cycle clock 5 or a derived reset signal, correspondingly resets the timer.

However, in case no $x^{th}$ memory cycle is started by a start clock 1 in the second time interval s of, for example, 5 s, i.e., no next refresh cycle 5 was started by such an $x^{th}$ memory cycle, then the next refresh cycle 5 is compulsorily triggered as an emergency refresh cycle 5 independently of the existence of $x^{th}$ memory cycle. For example, the next refresh cycle is triggered directly by the refresh generator, and in particular by the timer thereof on the basis of the pulse or clock 22. The emergency refresh cycle 5, started in this forced manner, for example, at the $16^{th}$μs (FIG. 4) prevents the loss of the information stored in the RAM memory unit group (for example, row) due to tardy refreshing.

In special cases, the emergency refresh cycle started in a forced manner for lack of time, particularly without an immediately-preceding memory cycle 1/2/3/4, can also be executed under simultaneous inhibit of the affected RAM memory unit for read and write cycles; however, this can cause a potentially unavoidable time loss. Insofar as possible, the emergency refresh cycle 5 should also be chronologically located, so to speak in the theoretically-conceivable pause tm before the next possible memory cycle 1/2/3/4 that the emergency refresh cycle 5 is sure to be ended with certainty before the beginning of the next possible memory cycle 1/2/3/4 and than an inhibit of the access can thereby be eliminated.

Because the read cycle 1/2/3/4 frequently lasts a shorter time than corresponding write cycles 1/2/3/4 (even when an EDC code is employed for protecting a data), the pauses tm following a read cycle 1/2/3/4 normally lasts longer than the pauses after a write cycle 1/2/3/4. The refresh cycle 5 inserted in accordance with the present invention is therefore preferably triggered by a read cycle 1/2/3/4 of the RAM memory unit.

Figure 3:
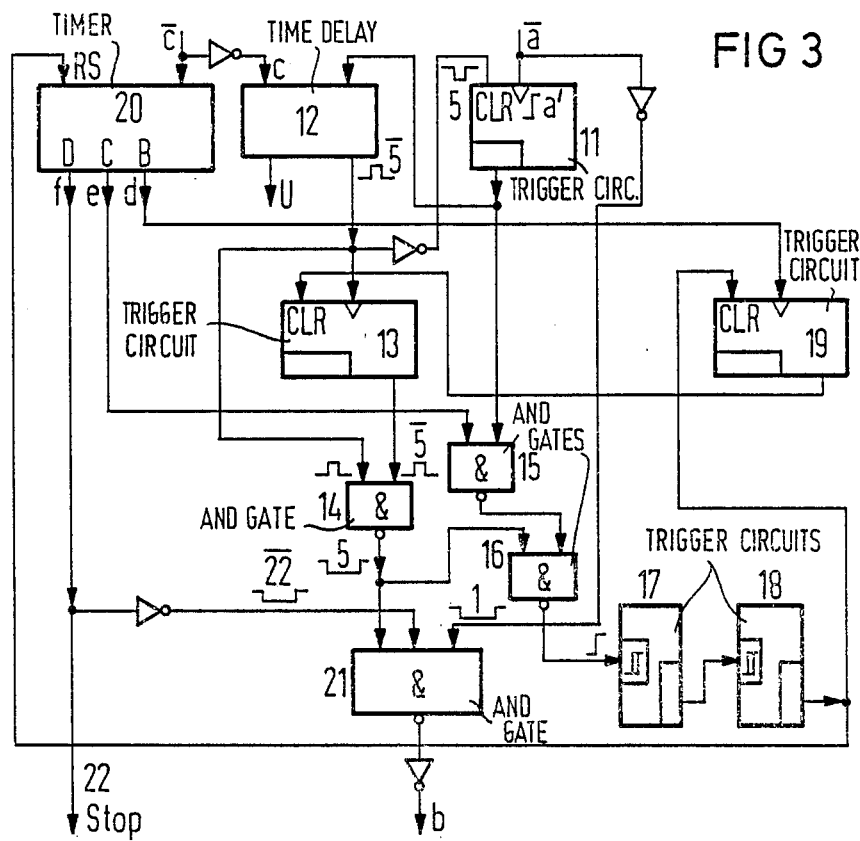
FIG. 3 is a schematic diagram of a particular exemplary control unit for controlling the refresh generator.

FIG. 3 illustrates an exemplary embodiment of a control unit which controls the refresh generator (not shown for reasons of clarity) of the RAM memory unit (likewise not shown for reasons of clarity) in accordance with the invention. The signal C or $\overline{C}$ represents the system clock (for example, of a large main memory or of a central control unit of an electronically-controlled switching system) which clocks one such RAM memory unit to be regularly refreshed in stages.

Here the system clock C which represents a pulse sequence at, for example, 1 MHz controls a timer 20.

Figure 4:
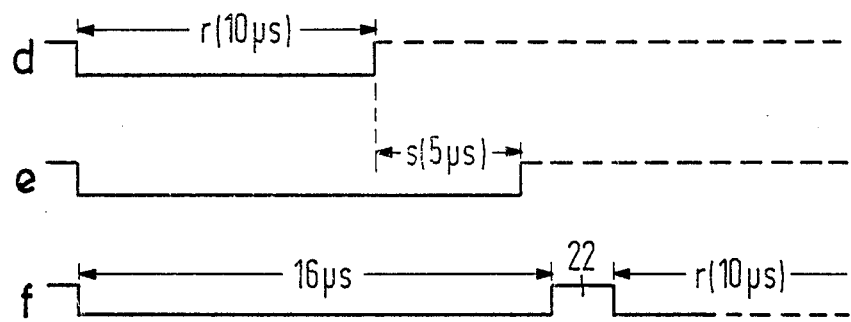
FIG. 4 is a timing diagram illustrating the course of various time intervals, particularly of the first time interval r and of the second time interval s.

The timer 20, for example, can be formed by a 4-bit counter with an appropriate, following code converter or by some differently-constructed timer so that, for example, it generates pulses at its outputs A, B and C which are suited to the 10 μs, 15 μs, and 16 μs clocks shown in FIG. 4 which correspond to the various pulses d, e and f, which are also referenced at the outputs B, C and D in FIG. 3. In the illustrated example, the pulses d, e and f first act on the trigger circuit 19 and the AND gates 15 and 21. More specifically, the pulse f is inverted to produce an inverted pulse 22 of the emergency refresh cycle clock 22 which acts on the AND gate 21. The inverted pulse 22 appears in the pulse f after the end of the second time interval s, here therefore in the 16$^{th}$ μs interval after the beginning of the first time interval r. The trigger circuit can be formed, for example, of a module ype 7474, the AND gate can be formed of a module type 7400 and the AND gate 21 can be formed by a module type 7410.

The system clock C further controls a time delay element 12, for example, a suitable shift register. A shift register 12 can be formed, for example, by a module type 74LS194.

The trigger circuit 11 is controlled by the pulse a, more precisely, by the inversion $\overline{a}$ thereof, i.e., by the start clocks 1 (FIGS. 1 and 2). From the start clock 1 or $\overline{1}$ of every memory cycle 1/2/3/4 supplied to the trigger circuit, more precisely, from the leading edge a' thereof, the time delay element 12 generates the accurately matching, delayed refresh cycle clock 5, in particular, the inversion clocked by the system clock C. The trigger circuit can be formed, for example, by a module of the type 7474.

The refresh cycle clock 5 or $\overline{5}$ generated with an accurate delay is fed to the AND gates 16 and 21 via the trigger circuit 13 and via the AND gate 14 and is also supplied to the clock input of the trigger circuit 11. The refresh cycle clock 5 or $\overline{5}$ is suitably delayed by the time delay element 12 from the leading edge a' of the start clock. The refresh cycle is further delayed by the transit times of the signal along the signal lines. The AND gate 21 is also supplied with the respective start clock 1. Due to corresponding superimpositions, the curve b of FIG. 1 therefore ultimately arises at the output of the AND gate 21 when clock 5 is present and the curve b of FIG. 2 arises when the clock 5 is present. The trigger circuit 13 can be formed, for example, by a module of the type 7474 and the AND gates 14 and 16 can each be formed by a module of the type 7400.

The time delay element (shift register) 12 can also supply other clocks, for example, an additional clock U after each refresh cycle 5 in order to supply the same to the refresh generator for switching to the next refresh cycle.

According to the invention, the two different operating modes are provided in the two time intervals r and s. After the first refresh cycle 5 or $\overline{5}$ that is executed after the beginning of the first time interval r, no further refresh cycles 5 or $\overline{5}$ are executed in accordance with the curve b in FIG. 1 during the first time interval r. The refresh cycles 5 or $\overline{5}$ are not executed again until the second, variable-length time interval s after a memory cycle 1/2/3/4 in accordance with the curve b in FIG. 2. As a result thereof, the memory cells are not necessarily refreshed far too often and unnecessary loads on the power supply of the refresh generator and of the RAM memory unit are also avoided.

In order for no further refresh cycle clock 5 or $\overline{5}$ to be generated at the output of the AND gate 21 after the first refresh cycle 5 the first time interval r which lasts, for example, 10 μs, the trigger circuit 19 is driven by the timer 20 in accordance with the line d of FIG. 4. After the first, executed refresh cycle, the trigger circuit 13 is therefore inhibited for the full remaining duration of the first time interval r. The output signal of the trigger circuit 19 via the CLR input of the trigger circuit 13 inhibits the trigger circuit 13, so that no further refresh cycle 5 or 5 can arise at the output of the trigger circuit 13 during the remaining duration of the first time interval r.

The second time interval s begins after the first time interval r. The second time interval s is variable and therefore potentially lasts, for example, between 0 and 5 μs and the memory cycle 1/2/3/4 is intended to immediately trigger another refresh cycle 5 or 5 in the second time interval s. With the beginning of the second time interval s, accordingly, a single combination approximately corresponding to the difference between the curves d and e is supplied to the AND gate 21. To this end, the curve e is supplied to the trigger circuit from the timer 20 via the output C and via the units 15, 16, 17 and 18 in the illustrated example and the curve d is also supplied via the out B of the timer 20 to the trigger circuit 19 and, therefore, the trigger circuit 13 is reset at the beginning of the second time interval s. The refresh cycle 5 or $\overline{5}$ of the present invention can therefore be triggered in the pause tm by the start clock 1 of a memory cycle.

When, in particular, a memory cycle, for example, a read cycle 1/2/3/4, is then started, the trigger circuit 13 can switch again and a refresh cycle clock 5 or $\overline{5}$ for a new refresh cycle again arises at the outputs of the AND gates 14 and 21. The read cycle 1/2/3/4 is started when a suitably delayed refresh cycle clock is generated via the trigger circuit 11 and the time delay circuit 12. In addition, moreover, the trigger circuit 19 is thereby reset via the AND gate 15 and, with the end of the clock 5, via the AND gate 16 as well as via the trigger circuits 17 and 18 which are formed, for example, by modules of the type 74221. Therewith, however, a reset signal RS is generated at the output of the trigger circuit 19 to reset the timer 20 so that a new first time interval r of, for example, 10 μs begins again. In this example, therefore, the start clock 1 triggers the end of the second time interval s almost immediately and, therefore, almost immediately triggers the (new) start of a following, first-time interval r. Again, for the duration of the first-time interval r defined by the timer 20, further memory cycles 1/2/3/4 can therefore no longer trigger the curves illustrated in FIG. 1.

However, when no memory cycle 1/2/3/4 occurred within the second time interval s, for example, after the resetting of the trigger circuit 19, then the trigger circuit is reset this time via the pulse of the curve e in FIG. 4 supplied by the timer 20 and by the AND gates 15 and 16 and the trigger circuits 17 and 18. In the illustrated example, this occurs at about 16 μs after the beginning a' of the most recently preceding, first time interval r. This is slightly delayed until approximately the beginning of the next first time interval r, after which the trigger circuit 13 can no longer supply a refresh cycle clock 5 or $\overline{5}$ to the AND gate 21 in the subsequently-following first time interval r. With approximately the same delay, the trigger circuit also resets the timer 20 by way of the reset signal RS. It is therefore assured that a first time interval r will again begin from the top after the end of the last second time interval s, with a slight delay. Between the last second time interval s and the following, new first time interval r, however, the illustrated example still also triggers the emergency refresh cycle via its "stop" output.

In this short intervening time between the last second time interval s and the following, first time interval r, in particular, the timer 20 supplies the curve f via its output d. This is the emergency refresh cycle clock 22 which is supplied by the timer 20 to the terminal "stop" whereby the clock 22 supplied thereto now triggers the emergency refresh cycle in the refresh generator. In addition, the clock 22 or 22 supplied from the timer 20 can then also be employed as needed for inhibiting the access to the RAM memory unit in a known manner. The inversion $\overline{22}$ of the clock is also supplied to the AND gate 21, as a result of which the AND gate is reliably inhibited for the duration of the clock $\overline{22}$. When so inhibited, the AND gate 21 can temporarily not output any signal at its output. Only when the clock 22 has ended can the AND gate 21 again forward the start clocks 1 and the refresh cycle clocks 5 and $\overline{5}$ generated during the first and the first and second time intervals r, s as shown in the curves b of FIGS. 1 and 2. A particular feature of this emergency refresh clock 22 that can be taken at the "stop" terminal is that it forces the triggering of the refresh cycle, i.e., without triggering a start clock 1.

Tests on a computer type SSP 112 D and SSP 112 R in the central control unit of an electronic EWSD telephone switching system comprising a multitude of RAM memory units operated in accordance with the present invention in RAM main memory have shown that a refresh cycle has to be forced only with great rarity, particularly when the program code stored in the RAM main memory had to be continuously read. Only after resuming operation of the RAM main memory after a current outage were many forced refresh cycles temporarily necessary for a brief interval since greater pauses in the memory operation temporarily occurred, i.e., particularly when reading the stored program code. The time saved by way of the present invention usually reached about 5% of the operating time in the normal mode. In other words, the computer or respectively, the central control unit could execute roughly 5% more switching functions under peak load than without the features of the present invention, doing so nearly without special, additional hardware expense or software expense for this extremely large-scale computer of the central control unit.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and preferably be included within the scope of my contribution to the art.

I claim:

1. A method for controlling refreshing of data in a random access memory which comprises a plurality of groups of memory cells, in which the refreshing is done in groups of memory cells so that normal read and/or write memory cycles can be executed between successive refreshing of two groups, which comprises a refresh generator for generating refresh voltages and a timer for measuring time intervals which comprise a predetermined short pause between the end of a memory cycle and the next following memory cycle, in which the memory cells are contained in at least one random access memory chip in which a predetermined maximum number of groups require the same predetermined maximum number of refresh cycles within a predetermined maximum time interval for refreshing all groups, the improvement comprising the steps of:

sensing the memory cycles;

controlling the time duration between successive refresh cycles differently in first and second time intervals generated by the timer, said second time interval immediately following and being shorter than said first time interval, said first time interval being longer than the minimum duration between the start times of two successive memory cycles, by triggering a refresh cycle at the beginning of said first time interval including generating a delayed clock in response to the leading edge of the start clock of a first memory cycle and terminating he refresh cycle before the beginning of the earliest possible next memory cycle, and preventing triggering of further refresh cycles after the first refresh cycle for each further memory cycle;

after the beginning of the second time interval, triggering the next refresh cycle for the next $x^{th}$ memory cycle and terminating the same before the start of the earliest possible $x+1^{st}$ memory cycle and resetting the timer in response to a memory cycle start clock to trigger a new first time interval and a new refresh cycle therein and preventing triggering of further refresh cycles in response to each further memory cycle; and triggering an emergency refresh cycle and a new first time interval in response to detecting the lack of the $x^{th}$ memory cycle and the associated refresh cycle in the second time interval.

2. The improved method of claim 1, wherein the steps of triggering the refresh cycles, except the emergency refresh cycle, are each further defined as:

triggering the refresh cycle in response to a read memory cycle.

3. In a control circuit for controlling refreshing of data in a random access memory which comprises a plurality of groups of memory cells, in which the refreshing is done in groups of memory cells so that normal read and/or write memory cycles can be executed between successive refreshing of two groups, which comprises a refresh generator for generating refresh voltages and a timer for measuring time intervals which comprise a predetermined short pause between the end of a memory cycle and the next following memory cycle, in which the memory cells are contained in at least one random access memory chip in which a predetermined maximum number of groups requires the same predetermined maximum number of refresh cycles within a predetermined maximum time interval for refreshing all groups in which the memory cycles are sensed, in which the time duration between successive refresh cycles is controlled differently in first and second time intervals, the second time interval immediately following and being shorter than the first time interval, and the first time being longer than the minimum duration between the start times of two successive memory cycles, by triggering the refresh cycle at the beginning cf the first time interval, including generating a delayed clock in response to the leading edge of the start clock of a first memory cycle and terminating the refresh cycle before the beginning of the earliest possible next memory cycle, and preventing triggering of further refresh cycles after the first refresh cycle for each further memory cycle, in which, after the beginning of the second time interval, the next refresh cycle is triggered for the next $x^{th}$ memory cycle and terminated before the start of the earliest possible $x+1^{st}$ memory cycle, and a new first time interval is triggered and a new refresh cycle is provided therein, and the triggering of further refresh cycles in response to each further memory cycle is prevented, and in which an emergency refresh cycle an a new first time interval are provided in response to detecting the lack of the $x_{th}$ memory cycle and the associated refresh cycle in the second time interval, the improvement therein comprising:

a resettable clock pulse counter for defining said first and second time intervals, said counter including a clock input for receiving a system clock and a reset input for receiving a reset pulse correlated with a refresh cycle.

* * * * *